(12) United States Patent
Smith

(10) Patent No.: US 10,187,706 B2
(45) Date of Patent: Jan. 22, 2019

(54) SNAP CLIP FASTENER ASSEMBLY

(71) Applicant: Ortronics, Inc., New London, CT (US)

(72) Inventor: Daniel M. Smith, Westerly, RI (US)

(73) Assignee: Ortronics, Inc., New London, CT (US)

( * ) Notice: Subject to any disclaimer, the term of this patent is extended or adjusted under 35 U.S.C. 154(b) by 0 days.

(21) Appl. No.: 15/599,766

(22) Filed: May 19, 2017

(65) Prior Publication Data

US 2018/0020269 A1    Jan. 18, 2018

Related U.S. Application Data

(60) Provisional application No. 62/361,261, filed on Jul. 12, 2016.

(51) Int. Cl.
| | | |
|---|---|---|
| *H04Q 1/06* | (2006.01) | |
| *H05K 7/14* | (2006.01) | |
| *G02B 6/38* | (2006.01) | |
| *F16L 3/015* | (2006.01) | |
| *H02G 3/14* | (2006.01) | |
| *G02B 6/44* | (2006.01) | |
| *H01R 13/73* | (2006.01) | |

(52) U.S. Cl.
CPC ............... *H04Q 1/06* (2013.01); *F16L 3/015* (2013.01); *G02B 6/3879* (2013.01); *G02B 6/3897* (2013.01); *H02G 3/14* (2013.01); *H05K 7/1487* (2013.01); *H05K 7/1491* (2013.01); *G02B 6/4453* (2013.01); *H01R 13/73* (2013.01)

(58) Field of Classification Search
CPC ......... H04Q 1/06; F16L 3/015; G02B 6/3879; G02B 6/3897; G02B 6/4453; H05K 7/1491; H01R 13/73
See application file for complete search history.

(56) References Cited

U.S. PATENT DOCUMENTS

| | | | | |
|---|---|---|---|---|
| 1,093,856 A | * | 4/1914 | Hurff ...................... | A01F 25/12 211/113 |
| 1,840,138 A | * | 1/1932 | Swallow ................... | A47F 1/12 248/222.12 |
| 2,757,890 A | * | 8/1956 | Sutton .................. | A47G 1/1606 248/225.21 |
| 3,249,983 A | * | 5/1966 | Cobaugh .............. | H01R 43/027 29/33 M |

(Continued)

OTHER PUBLICATIONS

U.S. Appl. No. 62/361,261, filed Jul. 12, 2016.

*Primary Examiner* — Anita M King
(74) *Attorney, Agent, or Firm* — McCarter & English, LLP

(57) ABSTRACT

Improved fastener assemblies and related methods of use are provided. The present disclosure provides improved fastener assemblies configured to mount to patching systems and/or enclosures for media connections (e.g., copper-based and/or fiber optic connections), and related methods of use. More particularly, the present disclosure provides advantageous systems/methods for the design and use of snap clip fastener assemblies configured to mount to media patching systems/enclosures that support media cables and/or facilitate cable management. The present disclosure provides for systems and methods for the design and use of improved fastener assemblies having advantageous attachment features and structures that are configured and dimensioned to easily mount with respect to a media patching system or enclosure or the like.

18 Claims, 10 Drawing Sheets

(56) References Cited

U.S. PATENT DOCUMENTS

| | | | | |
|---|---|---|---|---|
| 3,484,069 A | * | 12/1969 | Larson | A47F 5/0823 |
| | | | | 211/100 |
| 4,483,502 A | * | 11/1984 | Fast | A47F 5/0068 |
| | | | | 248/223.41 |
| 4,573,590 A | * | 3/1986 | Ellis | A47F 5/0068 |
| | | | | 211/118 |
| 4,767,012 A | * | 8/1988 | Simmons | A47F 5/0884 |
| | | | | 211/113 |
| 6,286,690 B1 | * | 9/2001 | Thalenfeld | A47F 5/0006 |
| | | | | 211/113 |
| 6,315,489 B1 | * | 11/2001 | Watanabe | E04F 13/0846 |
| | | | | 248/220.21 |
| 6,497,395 B1 | * | 12/2002 | Croker | H02G 3/30 |
| | | | | 211/103 |
| 7,697,811 B2 | | 4/2010 | Murano et al. | |
| 7,748,188 B2 | * | 7/2010 | Ito | E04F 13/0846 |
| | | | | 403/381 |
| 7,983,038 B2 | | 7/2011 | Levesque et al. | |
| 8,106,311 B2 | | 1/2012 | Larsen et al. | |
| 8,130,494 B2 | | 3/2012 | Larsen et al. | |
| 8,184,938 B2 | | 5/2012 | Cooke et al. | |
| 8,398,039 B2 | | 3/2013 | Murano et al. | |
| 9,606,317 B2 | | 7/2017 | Yang et al. | |
| 9,784,936 B2 | | 10/2017 | Grandidge et al. | |
| 2015/0364876 A1 | | 12/2015 | Grandidge et al. | |

* cited by examiner

SNAP CLIP FASTENER ASSEMBLY

CROSS-REFERENCE TO RELATED APPLICATIONS

This application claims the benefit of U.S. Provisional Application entitled "SNAP CLIP FASTENER ASSEMBLY," which was filed on Jul. 12, 2016, and assigned Ser. No. 62/361,261, the contents of which are herein incorporated by reference in their entirety.

FIELD OF THE DISCLOSURE

The present disclosure relates to fastener assemblies configured to mount to systems and/or enclosures for media connections (e.g., copper-based and/or fiber optic connections) and, more particularly to the design and use of snap clip fastener assemblies configured to mount to media patching systems/enclosures that provide patching functionalities, support media cables and/or facilitate cable management.

BACKGROUND OF THE DISCLOSURE

In general, many data transfer media includes multiple lines/fibers bundled together. Communications systems typically incorporate such media (e.g., unshielded twisted pair cables/media, fiber optic cables, etc.) for data transfer. In general, commercial buildings require an effective and efficient telecommunications infrastructure to support the wide variety of services that rely on the transport of information. Typically, wiring/cabling systems within buildings are terminated at a location where they may be interconnected with one another, and/or to other cabling systems or telecommunications equipment. Cables are often terminated on wire panels or patch panels or the like, which can be mounted to racks or to some other location/structure.

Patch panels are known in the field of data communication systems. Some exemplary assemblies/systems in this general field are described and disclosed in U.S. Pat. Nos. 7,697,811; 7,983,038; 8,106,311; 8,130,494; 8,184,938; 8,398,039; 9,606,317; and U.S. Patent Pub. Nos. 2015-0362689 and 2015-0364876, the entire contents of each being hereby incorporated by reference in their entireties.

A patch panel generally provides a plurality of network ports incorporated into a structural element that connect incoming and outgoing lines of a communication/electrical system (e.g., a local area network (LAN) or the like). Typical patch panels are mounted hardware units that include a plurality of port locations, and utilize cables for interconnections. A patch panel can use patch cords to create the interconnections. Patch panel systems are generally intended to facilitate organization and management in implementing telecommunications wiring systems (e.g., for high speed data networks).

In general, many rows of cabinets or racks typically fill a data center or telecommunications room. Patch panels affixed to a rack and/or a telecommunications room provide convenient access to telecommunication devices (e.g., servers) within the rack or room. As the demand for the use of telecommunication devices rapidly grows, space for such devices becomes limited and/or expensive.

A constant need exists among manufacturers to develop patch panel assemblies/patching systems and related devices/accessories that are cost-effective and/or include improved features/structures.

Thus, an interest exists for improved patch panel assemblies/patching systems and related devices/accessories, and related methods of use. These and other inefficiencies and opportunities for improvement are addressed and/or overcome by the assemblies, systems and methods of the present disclosure.

SUMMARY OF THE DISCLOSURE

The present disclosure provides advantageous fastener assemblies, and improved methods/systems for using the same. The present disclosure provides advantageous fastener assemblies configured to mount to patching systems and/or enclosures for media connections. More particularly, the present disclosure provides improved systems/methods for the design and use of snap clip fastener assemblies configured to mount to media patching systems/enclosures that support media cables and/or facilitate cable management.

In exemplary embodiments, disclosed herein is an improved fastener assembly having advantageous attachment features/structures that are configured and dimensioned to mount with respect to a media patching system or enclosure.

The present disclosure provides for a fastener assembly including a planar wall extending from a first end to a second end; a first protrusion member, a second protrusion member, a third protrusion member and a fourth protrusion member extending from the planar wall; wherein the first and second protrusion members are configured and dimensioned to mount with respect to a base member to secure the planar wall to the base member; and wherein the third and fourth protrusion members are configured and dimensioned to mount with respect to a panel member to secure the panel member to the planar wall and to the base member.

The present disclosure also provides for a fastener assembly wherein the planar wall includes a front side and a rear side; and wherein the first and second protrusion members extend from the rear side of the planar wall; and wherein the third and fourth protrusion members extend from the front side of the planar wall. The present disclosure also provides for a fastener assembly wherein the third protrusion member is positioned proximal to the first end of the planar wall and the fourth protrusion member is positioned proximal to the second end of the planar wall; and wherein the first and second protrusion members are positioned next to one another between the third and fourth protrusion members.

The present disclosure also provides for a fastener assembly wherein the first end includes a first hemmed section, the first hemmed section configured and dimensioned to mount with respect to the base member to secure the planar wall to the base member. The present disclosure also provides for a fastener assembly wherein the second end includes a second hemmed section, the second hemmed section configured and dimensioned to mount with respect to the base member to secure the planar wall to the base member. The present disclosure also provides for a fastener assembly wherein the first and second hemmed sections each include a first portion that extends substantially perpendicular away from the planar wall and a second portion that extends substantially perpendicular away from the first portion. The present disclosure also provides for a fastener assembly wherein each second portion is substantially parallel to the planar wall; and wherein each first and second portion extend to define a pocket area.

The present disclosure also provides for a fastener assembly wherein the first, second, third and fourth protrusion members each take the form of a quadrant shape, and each quadrant shapes includes first and second sides that extend away from the planar wall and an arc side that is attached to the planar wall. The present disclosure also provides for a fastener assembly wherein the first and second sides are perpendicular to one another, and the arc side defines a 90° arc.

The present disclosure also provides for a fastener assembly wherein the first, second, third and fourth protrusion members each define an opening through the planar wall. The present disclosure also provides for a fastener assembly wherein the panel member has a front panel surface that includes a plurality of apertures therethrough, each aperture configured to mount with respect to a connector assembly or connective device.

The present disclosure also provides for a fastener assembly wherein the base member includes a mounting tab, the mounting tab including a first hole and a second hole; and wherein the first protrusion member is configured to mount within the first hole and the second protrusion member is configured to mount within the second hole. The present disclosure also provides for a fastener assembly wherein the panel member includes a third hole and a fourth hole; and wherein the third protrusion member is configured to mount within the third hole and the fourth protrusion member is configured to mount within the fourth hole.

The present disclosure also provides for a method of mounting a fastener assembly including providing a planar wall extending from a first end to a second end; providing a first protrusion member, a second protrusion member, a third protrusion member and a fourth protrusion member extending from the planar wall; mounting the first and second protrusion members with respect to a base member to secure the planar wall to the base member; and mounting the third and fourth protrusion members with respect to a panel member to secure the panel member to the planar wall and to the base member.

The present disclosure also provides for a method of mounting a fastener assembly wherein the planar wall includes a front side and a rear side; and wherein the first and second protrusion members extend from the rear side of the planar wall; and wherein the third and fourth protrusion members extend from the front side of the planar wall. The present disclosure also provides for a method of mounting a fastener assembly wherein the third protrusion member is positioned proximal to the first end of the planar wall and the fourth protrusion member is positioned proximal to the second end of the planar wall; and wherein the first and second protrusion members are positioned next to one another between the third and fourth protrusion members.

The present disclosure also provides for a method of mounting a fastener assembly wherein the first end includes a first hemmed section, the first hemmed section configured and dimensioned to mount with respect to the base member to secure the planar wall to the base member. The present disclosure also provides for a method of mounting a fastener assembly wherein the second end includes a second hemmed section, the second hemmed section configured and dimensioned to mount with respect to the base member to secure the planar wall to the base member. The present disclosure also provides for a method of mounting a fastener assembly wherein the first and second hemmed sections each include a first portion that extends substantially perpendicular away from the planar wall and a second portion that extends substantially perpendicular away from the first portion. The present disclosure also provides for a method of mounting a fastener assembly wherein each second portion is substantially parallel to the planar wall; and wherein each first and second portion extend to define a pocket area.

The present disclosure also provides for a method of mounting a fastener assembly wherein the first, second, third and fourth protrusion members each take the form of a quadrant shape, and each quadrant shapes includes first and second sides that extend away from the planar wall and an arc side that is attached to the planar wall. The present disclosure also provides for a method of mounting a fastener assembly wherein the first and second sides are perpendicular to one another, and the arc side defines a 90° arc.

The present disclosure also provides for a method of mounting a fastener assembly wherein the first, second, third and fourth protrusion members each define an opening through the planar wall. The present disclosure also provides for a method of mounting a fastener assembly wherein the panel member has a front panel surface that includes a plurality of apertures therethrough, each aperture configured to mount with respect to a connector assembly or connective device.

The present disclosure also provides for a method of mounting a fastener assembly wherein the base member includes a mounting tab, the mounting tab including a first hole and a second hole; and wherein the first protrusion member mounts within the first hole and the second protrusion member mounts within the second hole. The present disclosure also provides for a method of mounting a fastener assembly wherein the panel member includes a third hole and a fourth hole; and wherein the third protrusion member mounts within the third hole and the fourth protrusion member mounts within the fourth hole.

The present disclosure also provides for a fastener assembly including a planar wall including a front side and a rear side and extending from a first end to a second end, the first end including a first hemmed section and the second end including a second hemmed section; a first protrusion member, a second protrusion member, a third protrusion member and a fourth protrusion member extending from the planar wall; wherein the first and second protrusion members extend from the rear side of the planar wall; wherein the third and fourth protrusion members extend from the front side of the planar wall; wherein the first and second protrusion members and the first and second hemmed sections are configured and dimensioned to mount with respect to a base member to secure the planar wall to the base member; and wherein the third and fourth protrusion members are configured and dimensioned to mount with respect to a panel member to secure the panel member to the planar wall and to the base member.

Any combination or permutation of embodiments is envisioned. Additional advantageous features, functions and applications of the disclosed systems, methods and assemblies of the present disclosure will be apparent from the description which follows, particularly when read in conjunction with the appended figures. All references listed in this disclosure are hereby incorporated by reference in their entireties.

BRIEF DESCRIPTION OF THE DRAWINGS

Features and aspects of embodiments are described below with reference to the accompanying drawings, in which elements are not necessarily depicted to scale.

Exemplary embodiments of the present disclosure are further described with reference to the appended figures. It is to be noted that the various features, steps and combinations of features/steps described below and illustrated in the figures can be arranged and organized differently to result in embodiments which are still within the scope of the present disclosure. To assist those of ordinary skill in the art in making and using the disclosed assemblies, systems and methods, reference is made to the appended figures, wherein.

DETAILED DESCRIPTION OF DISCLOSURE

Figure 1:
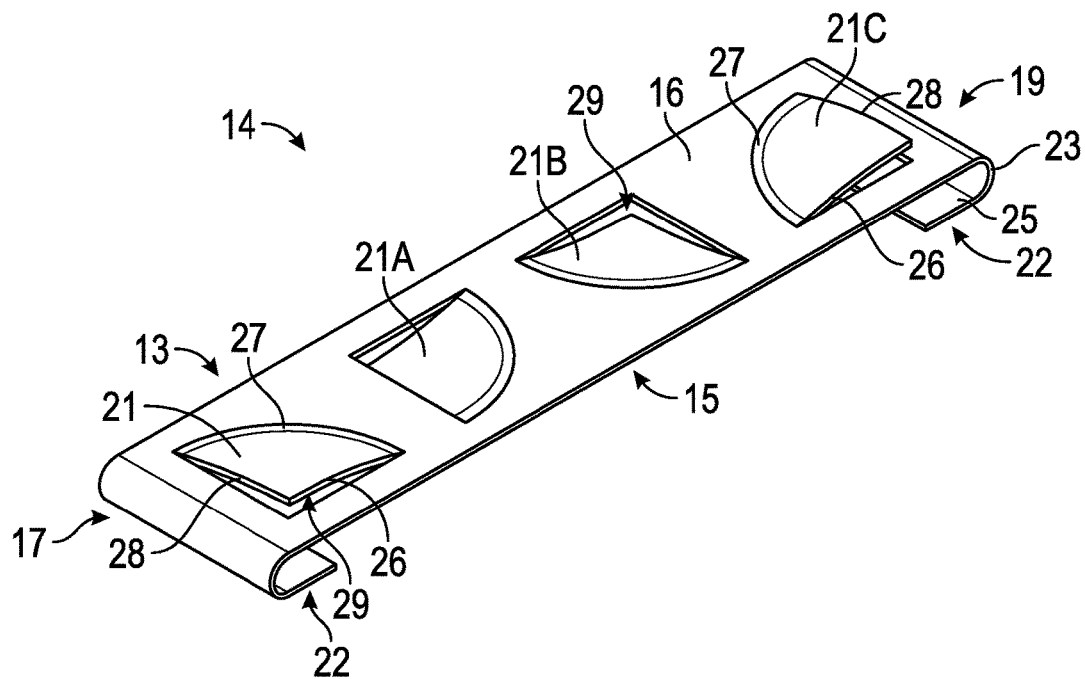
FIG. 1 is a front perspective view of an exemplary fastener assembly of the present disclosure.
Figure 2:
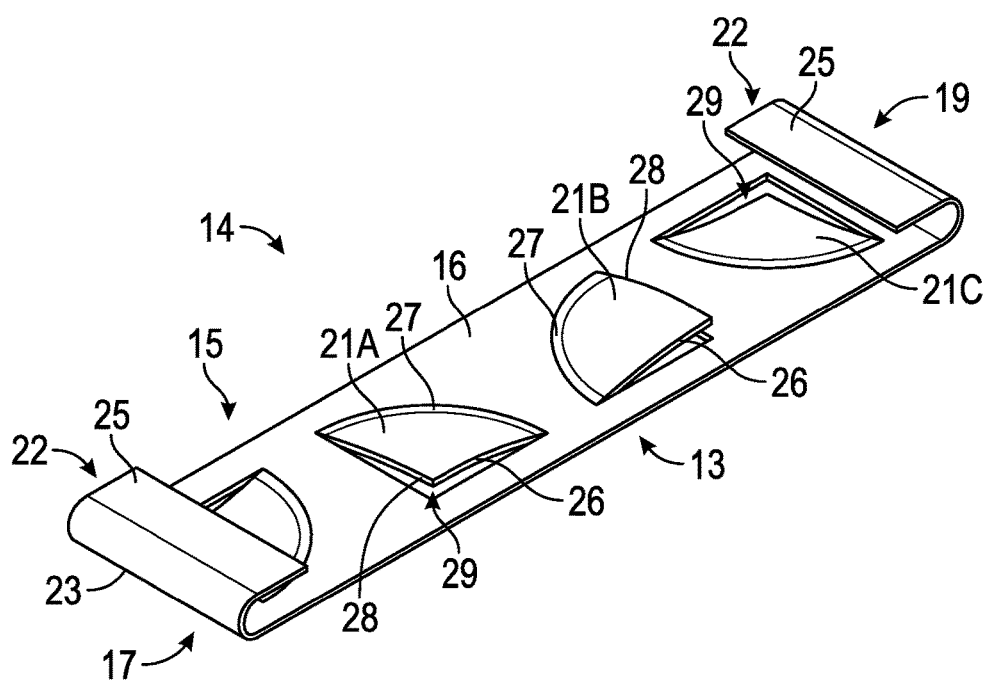
FIG. 2 is a rear perspective view of the fastener assembly of FIG. 1.
Figure 3:
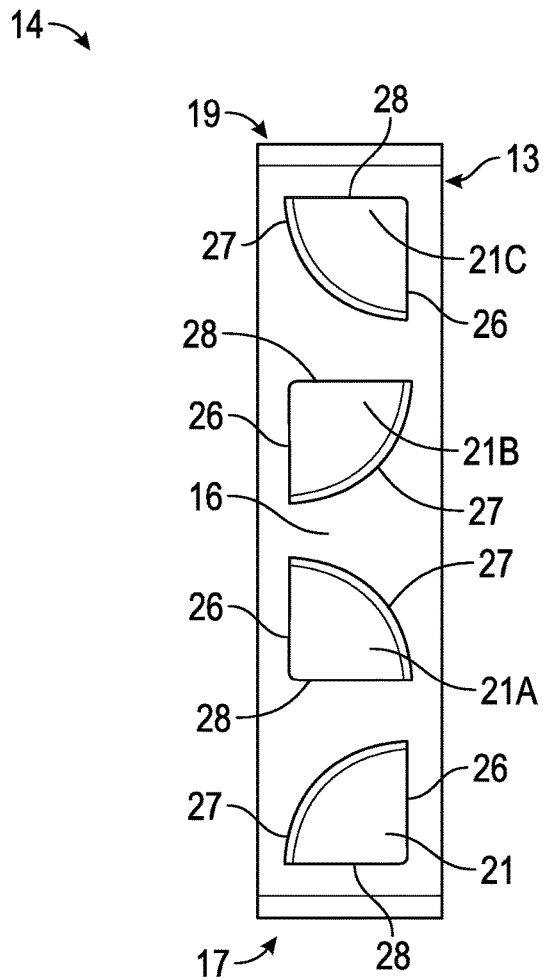
FIG. 3 is a front view of the fastener assembly of FIG. 1.

The exemplary embodiments disclosed herein are illustrative of advantageous fastener assemblies, and systems of the present disclosure and methods/techniques thereof. It should be understood, however, that the disclosed embodiments are merely exemplary of the present disclosure, which may be embodied in various forms. Therefore, details disclosed herein with reference to exemplary fastener assemblies/fabrication methods and associated processes/techniques of assembly and use are not to be interpreted as limiting, but merely as the basis for teaching one skilled in the art how to make and use the advantageous fastener assemblies/systems and/or alternative assemblies of the present disclosure.

In general, the present disclosure provides improved fastener assemblies, and related methods of use. The present disclosure provides improved fastener assemblies configured to mount to patching systems and/or enclosures for media connections (e.g., copper-based and/or fiber optic connections), and related methods of use. More particularly, the present disclosure provides advantageous systems/methods for the design and use of snap clip fastener assemblies configured to mount to media patching systems/enclosures that support media cables and/or facilitate cable management.

Current practice provides that an interest exists for improved patch panel assemblies/patching systems and related devices/accessories. In exemplary embodiments, the present disclosure provides for systems/methods for the design and use of improved fastener assemblies having advantageous attachment features/structures that are configured and dimensioned to easily mount with respect to a media patching system or enclosure, thereby providing a significant operational, commercial and/or manufacturing advantage as a result.

Referring now to the drawings, like parts are marked throughout the specification and drawings with the same reference numerals, respectively. Drawing figures are not necessarily to scale and in certain views, parts may have been exaggerated for purposes of clarity.

With reference to FIGS. 1-4 and 6, there is illustrated embodiments of exemplary fastener assemblies 14 according to the present disclosure. In general and as discussed further below, each snap clip fastener assembly 14 is configured and dimensioned to mount to patching systems and/or enclosures 10, 100, 200 for media connections (e.g., copper-based and/or fiber optic connections). More particularly, each fastener assembly 14 is configured and dimensioned to mount to media patching systems/enclosures 10, 100, 200, with the systems/enclosures 10, 100, 200 configured and adapted to provide patching functionalities, support media cables and/or facilitate cable management.

Figure 19:
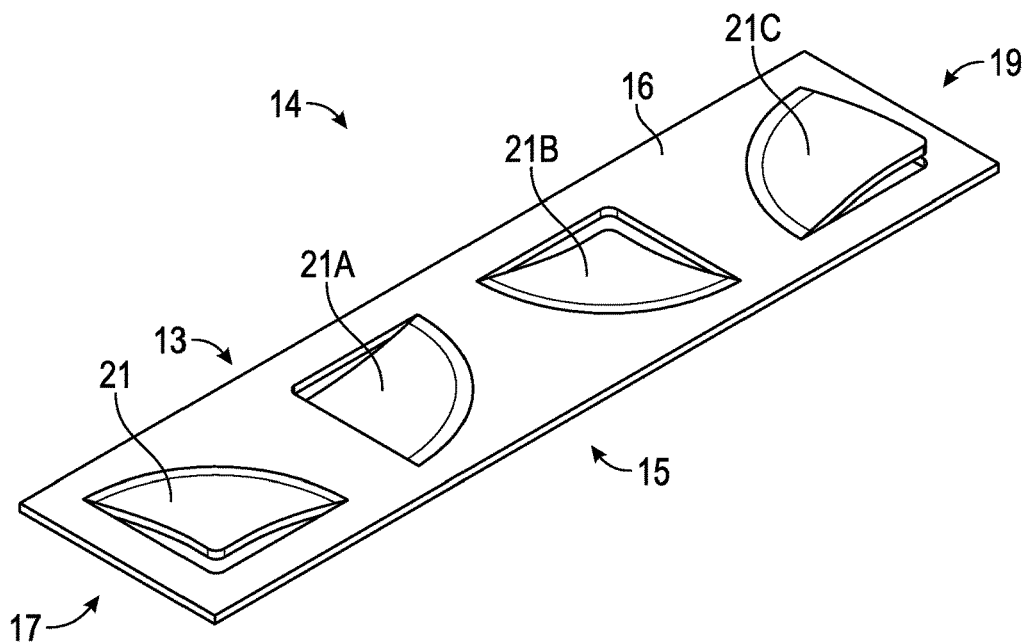
FIG. 19 is a front perspective view of another exemplary fastener assembly.

As shown in FIGS. 1-4 and 19, each exemplary fastener assembly 14 includes a planar wall 16 that has a front side 13 and a rear side 15, with the wall 16 extending from a first end 17 to a second end 19. In exemplary embodiments, each end 17, 19 may include a curved or hemmed section 22. In other embodiments and as shown in FIG. 19, each end 17, 19 may not include curved/hemmed section 22. In further embodiments, end 17 may include hemmed section 22 and end 19 may not include hemmed section 22, or end 17 may not include hemmed section 22 and end 19 may include hemmed section 22.

Figure 4:
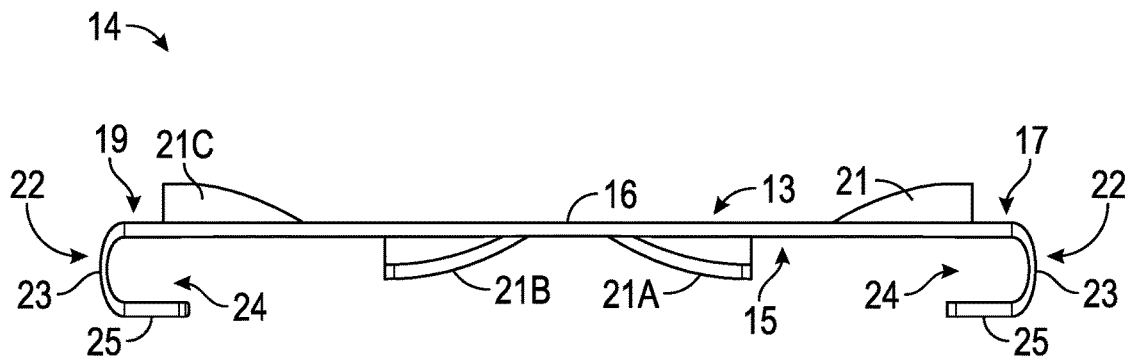
FIG. 4 is a top view of the fastener assembly of FIG. 1.

In some embodiments and with reference to FIGS. 1-4, each curved/hemmed section 22 includes a first portion 23 that curves and/or extends substantially perpendicular away from planar wall 16 from front side 13 toward rear side 15, and a second portion 25 that extends substantially perpendicular away from the first portion 23. As such and as shown in FIG. 4, exemplary second portion 25 is substantially parallel to planar wall 16. As depicted in FIG. 4, ends 17, 19 of wall 16 and exemplary portions 23, 25 curve and/or extend to define pocket areas 24 on each end 17, 19 of fastener assembly 14, as discussed further below.

In general, fastener assembly 14 includes at least one detent or protrusion member 21. As shown in FIGS. 1-4, exemplary fastener assembly 14 includes four detent/protrusion members 21, 21A, 21B and 21C.

In certain embodiments, protrusion members 21, 21A, 21B, 21C of planar wall 16 are fabricated by metal stamping or the like, although the present disclosure is not limited thereto. Exemplary planar wall 16 is fabricated from spring-temper material (e.g., phosphor bronze). However, it is noted that planar wall 16 can be fabricated from a variety of materials, and can take a variety of shapes/forms. It is also noted that hemmed sections 22 can be fabricated/formed via a metal stamping process or the like (e.g., the ends 17, 19 of wall 16 can be bent/curved to form hemmed sections 22).

As shown in FIGS. 1-4, protrusion member 21 is positioned proximal or adjacent to first end 17, and protrusion member 21C is positioned proximal or adjacent to second end 19. Protrusion member 21A is positioned between protrusion members 21 and 21B, and protrusion member 21B is positioned between protrusion members 21A and 21C. As such, the outer protrusion members 21, 21C of wall 16 are positioned next to ends 17, 19, respectively, and the inner protrusion members 21A, 21B are positioned next to one another between the outer protrusion members 21, 21C.

Figure 20:
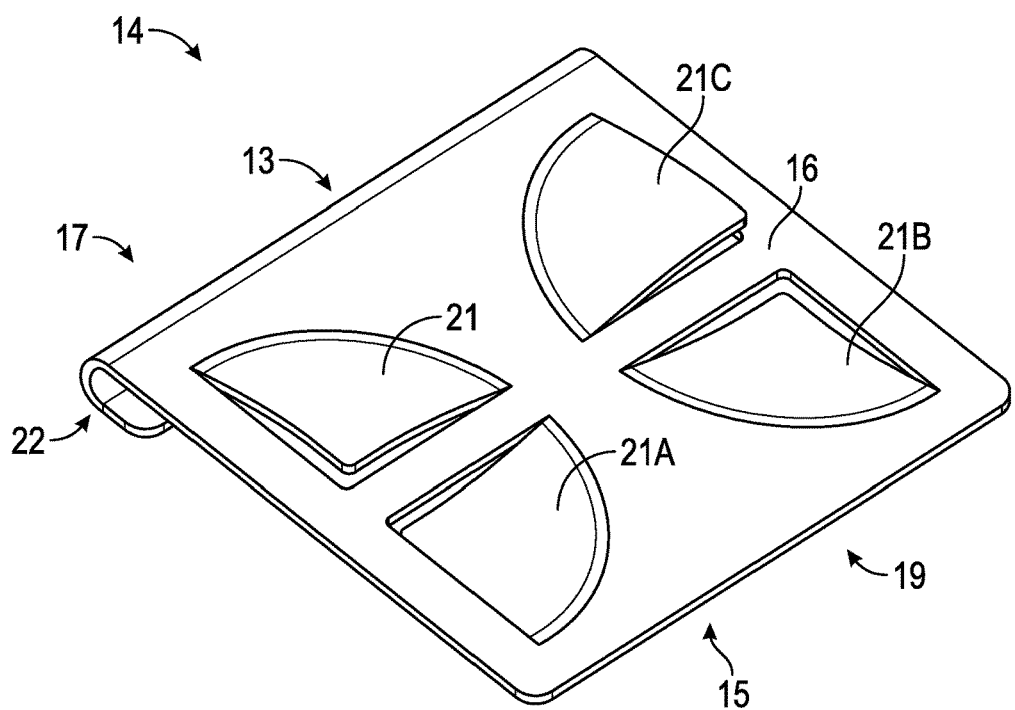
FIG. 20 is a front perspective view of another exemplary fastener assembly.

In other embodiments and as shown in FIG. 20, protrusion members 21, 21C are positioned proximal or adjacent to first end 17, and protrusion members 21A, 21B are positioned proximal or adjacent to second end 19. It is noted that the design, orientation and/or layout of protrusion members 21, 21A, 21B, 21C of wall 16 can take a variety of configurations, forms, patterns and/or designs. FIG. 20 also shows exemplary assembly 14 having one hemmed section 22 at first end 17.

In exemplary embodiments, the outer protrusion members 21, 21C extend or protrude away from the wall 16 from the front side 13, and the inner protrusion members 21A, 21B extend or protrude away from the wall 16 from the rear side 15. However, it is noted that the protrusion members 21, 21A, 21B, 21C can each extend away from the wall 16 in a variety of ways (e.g., inner members 21A, 21B from front side 13 and outer members 21, 21C from rear side 15; members 21 and 21B from front side 13 and members 21A and 21C from rear side 15, etc.).

In exemplary embodiments, each protrusion member 21, 21A, 21B, 21C takes the form of a quadrant shape, and includes first and second sides 26, 28 that extend away from wall 16, and includes an arc side 27 (e.g., 90° arc side 27) that remains attached to wall 16. Exemplary sides 26, 28 are perpendicular to one another and are not attached to wall 16, thereby forming an opening or aperture 29 through planar wall 16. However, it is noted that protrusion members 21, 21A, 21B, 21C can take a variety of shapes, forms and/or designs (e.g., quadrant shaped with two sides attached to wall and arc side not attached to wall; square or rectangular shaped with three sides not attached to wall 16; semicircular in shape with one side not attached to wall; a dent or protruding bulge in wall 16 with all sides attached to wall 16, etc.).

As shown in FIGS. 5-10, two fastener assemblies 14 are configured and dimensioned to mount to a base member 12 of a media patching system 10. In general, media patching system 10 is configured and dimensioned to be used as a patching system for media connections, as described and disclosed in U.S. Pat. No. 9,606,317, the entire contents of which is hereby incorporated by reference in its entirety. More particularly, media patching system 10 can be configured to support high density, multiple (mixed) media connections. It is noted that media patching system 10 can take a variety of forms, shapes and/or designs.

In exemplary embodiments, system 10 is a high density patching system configured to support multiple media connections. In certain embodiments, system 10 provides users with the ability to install multiple media connections (e.g., copper-based connections, fiber optic connections, combinations thereof, or the like) in the same patching system/enclosure 10.

A panel member 20 (e.g., patch panel member/multi-connector panel member 20) can be utilized with system 10 to support multiple media connections (e.g., copper and/or fiber optic connections). Exemplary panel member 20 has a front panel surface that includes a plurality of apertures therethrough, with each aperture configured to have a connector assembly/connective device (e.g., ports/adapters, cassettes, etc.) mounted with respect thereto. Panel member 20 can take a variety of shapes, forms and/or geometries. In certain embodiments, media patching system 10 is configured and dimensioned to be mounted with respect to a supporting structure or the like (e.g., rack, network/server rack, frames, cabinets, etc.).

Figure 5:
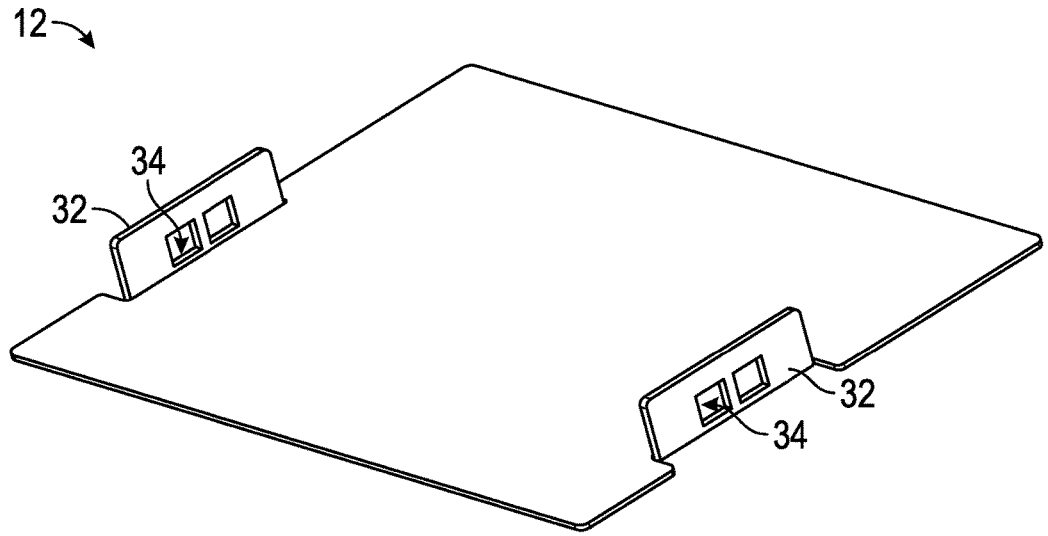
FIG. 5 is a side perspective view of an exemplary base member of a media patching system of the present disclosure.
Figure 6:
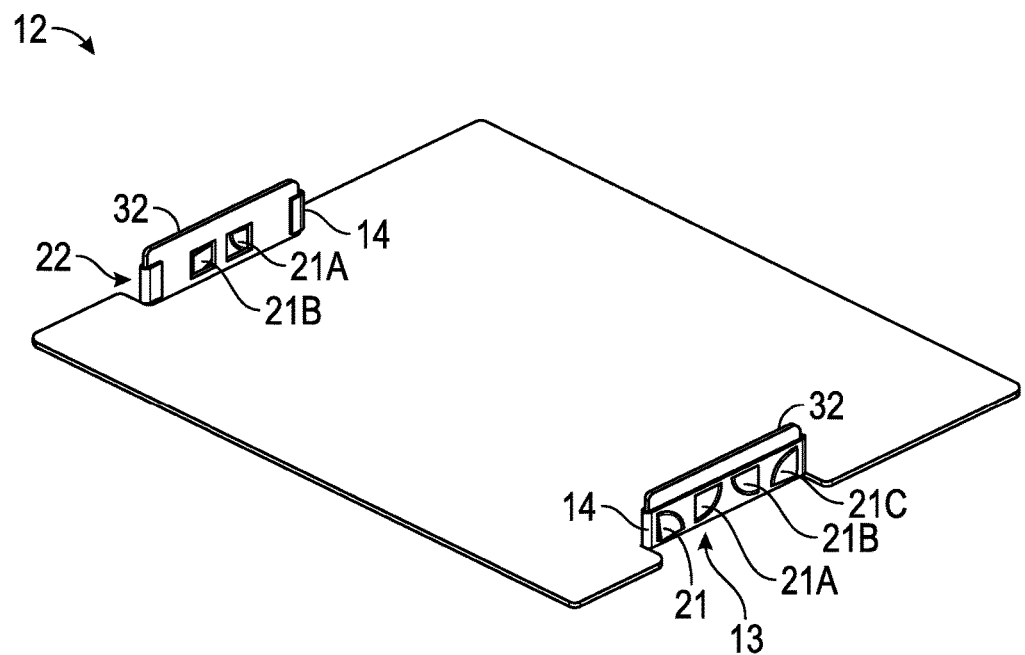
FIG. 6 is a side perspective view of the base member of FIG. 5, with exemplary fastener assemblies mounted to the base member.

As shown in FIGS. 5-6, exemplary base member 12 (e.g., sheet metal cassette base member 12, such as a UHD cassette base member 12) of media patching system 10 includes a mounting tab member 32 on each side of member 12. Each tab member 32 includes one or more holes 34 therethrough (e.g., two square holes 34).

A fastener assembly 14 is configured and adapted to be positioned over a tab member 32 until inner protrusion members 21A, 21B are securely positioned within a respective hole 34 of tab member 32 (e.g., via an interference or snap-fit engagement of members 21A, 21B in holes 34). Moreover, the optional hemmed section(s) 22 can wrap around and secure/mount to the ends of the tab member 32. As such and as shown in FIG. 6, fastener assembly 14 can be secured/mounted to tab member 32 of base member 12, with the front side 13 of wall 16 facing outwards (away from member 12), and with the rear side 15 of wall 16 facing the outer surface of tab member 32, and with members 21A, 21B positioned within holes 34 and extending from the rear side 15 and into holes 34, and optional hemmed section(s) 22 mounted to ends of tab 32 (when present). It is noted that the exemplary 180° design/shape of the optional hemmed sections 22 and pocket 24 can advantageously facilitate mounting of assembly 14 to member 12 by hand (e.g., without the use of tools). In short, the inner protrusion members 21A, 21B operate along with the hems 22 to retain assembly 14 onto its mounting location on tab 32. Protrusion members 21 and 21C extend from front side 13, away from base member 12.

In other embodiments and as noted, assembly 14 may not include hemmed sections 22. For example, during automated assembly of fastener 14 to system 10, 100, 200 (e.g. robotic assembly or some other automated process), the hems 22 may not be needed, and an assembly 14 shown in FIG. 19 can be employed. An automated process would not necessarily require the hems 22 to hold the snap clip assembly 14 in place prior to final assembly (after which the clip 14 is captive), as the tooling fixtures for the robot/assembly machine can immobilize the clip 14 long enough for it to perform its intended function. In other embodiments and as discussed above, assembly 14 can include one hemmed section 22 (e.g., at end 17 or 19).

Referring now back to FIG. 6, it is noted that apertures 29 can advantageously allow welding access to a user via apertures 29 of assembly 14, to further securely mount assembly 14 to member 12 (e.g., via spot welds or the like).

Figure 7:
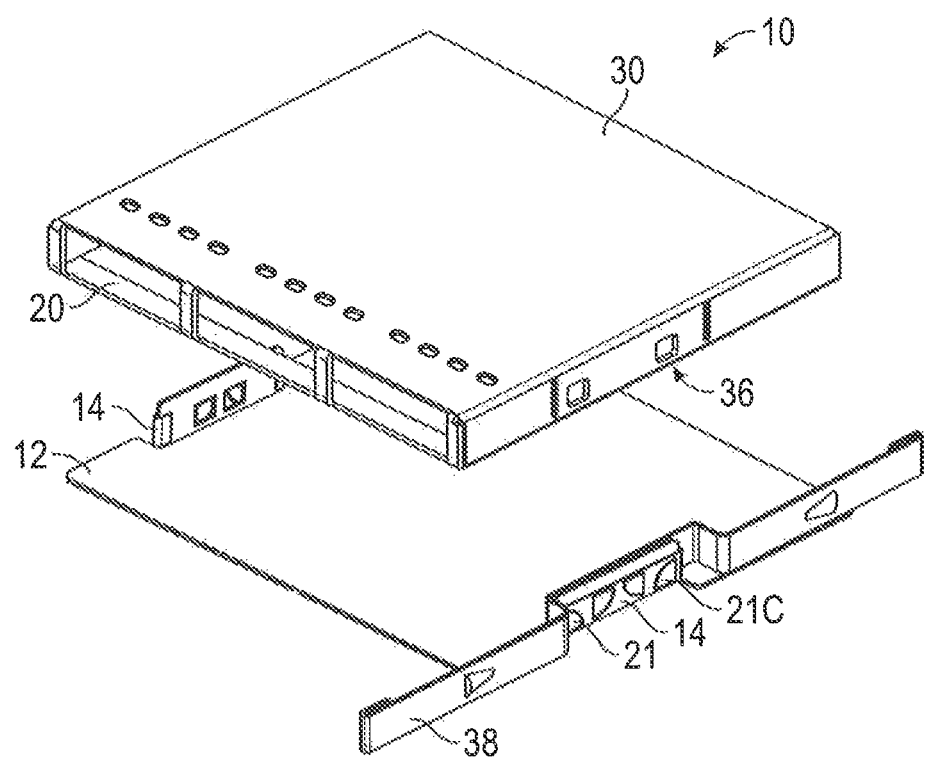
FIG. 7 is a side perspective view of the base member and mounted fastener assemblies of FIG. 6, and showing a panel member and cover member pre-assembly.

It is noted that the exemplary tabs 32 are formed with two square holes 34 to accept the inner members 21A, 21B of assembly 14, so that the assembly 14 can be mounted by hand (without tools) simply by sliding the assembly 14 over the tab 32. As noted, in such a mounted position (FIG. 6), protrusion members 21 and 21C extend from front side 13, away from base member 12, and are pointing in the downward direction (toward the bottom of the page in FIG. 6). As discussed further below and as shown in FIGS. 7-10, a panel member 20 and/or cover member 30 can then be mounted (e.g., snap fit) over the base member 12 with mounted assembly 14, and with the protrusion members 21, 21C securely positioned within a respective hole 36 of panel member 20 and/or cover member 30 (e.g., via an interference or snap-fit engagement of members 21, 21C in holes 36). As shown in FIG. 7, panel member 20 and/or cover member 30 includes one or more holes 36 (e.g., two square holes 36 on each side).

Figure 8:
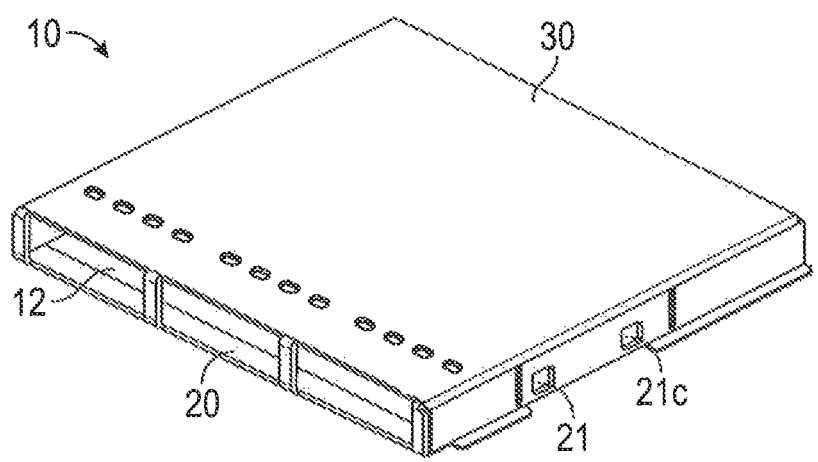
FIGS. 8-10 are side perspective views of the base member, mounted fastener assemblies, panel member and cover member, after assembly.
Figure 9:
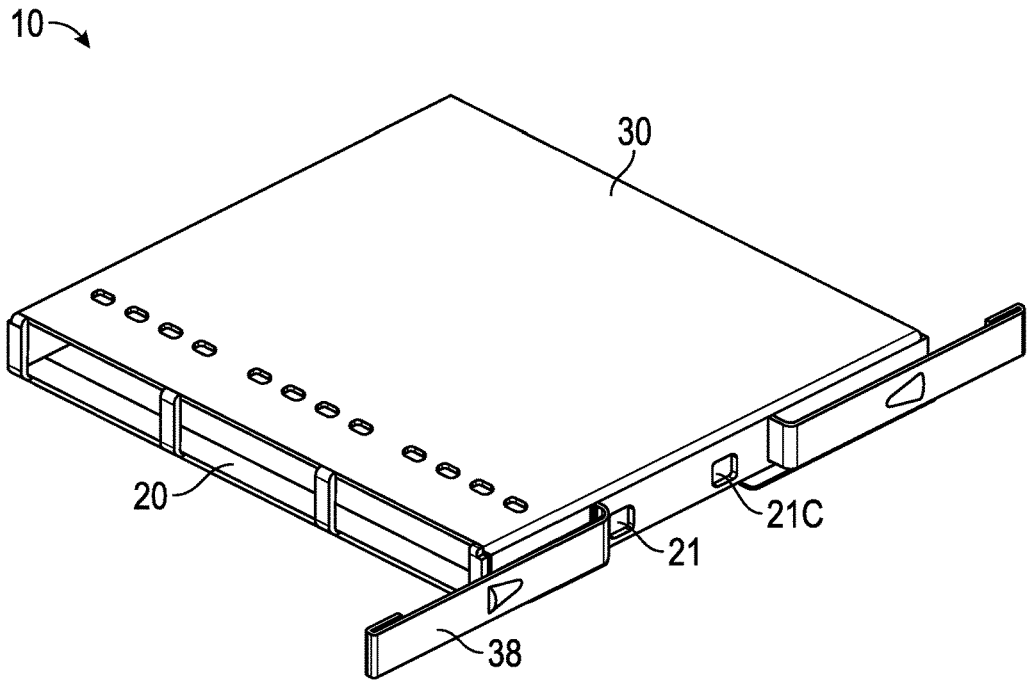

In FIG. 8, the system 10 is shown without the retainer bar 38, and the square holes 36 on the member 20/30 align with the outer detents 21, 21C on the assembly 14. The other side of the member 20/30 has similar features to mate to the assembly 14 on that side of the system 10. By modifying the retainer bar 38 as shown in FIG. 9, bar 38 can be held captive and secure between the cassette base 12 and member 20/30.

It is noted that a conventional media patching system can require at least twelve parts (base, cover, retainer bar, four PEMs, two short screws, two long screws, and a machined bar), can require a welding step (for the machined bar onto the retaining bar), can require a press to insert the PEMs, and can require a screwdriver to assemble the screws. However, assembly 14 mounted on base 12 allows one to achieve system 10 with just five parts (base 12, cover/panel panel/cover 20/30, retainer bar 38, and two snap clip assemblies 14), and allows system 10 to be hand assembled, with no tools required. As an added benefit, the system 10 is quasi-permanent, as it typically may not be disassembled without damaging one or both assemblies 14, giving the resultant system 10 inherent tamper-resistance.

Figure 10:
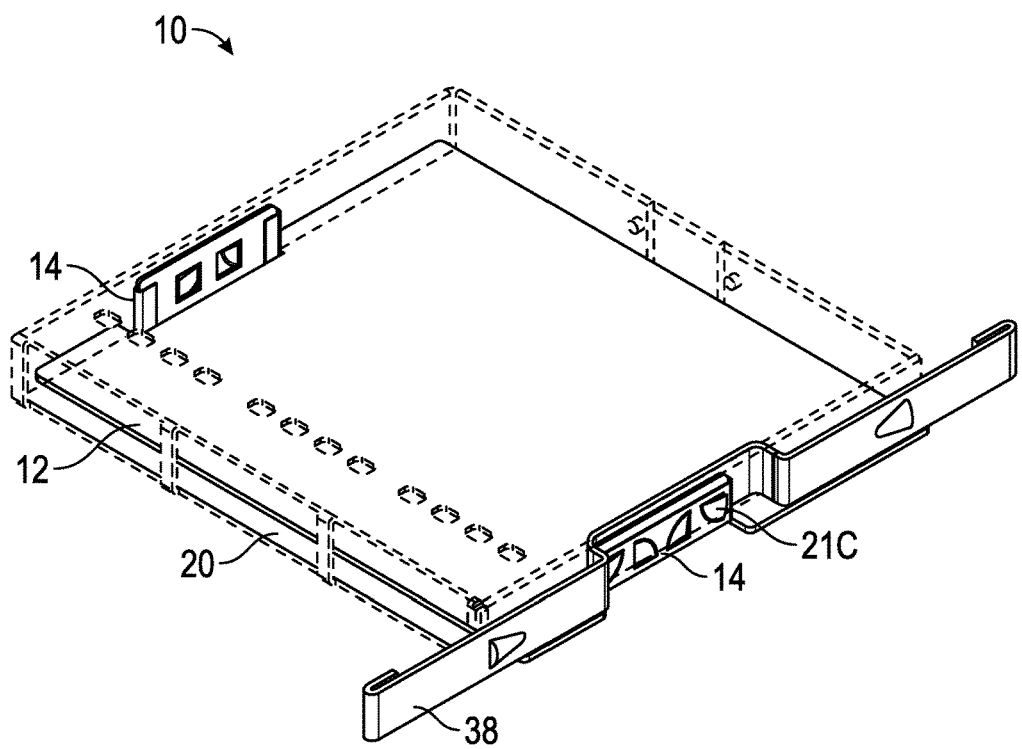

As such, FIGS. 5-10 show a system/enclosure 10 (e.g., an M7-sized cassette enclosure, less the adapters), with the top cover 30 viewed as transparent in FIG. 10 to show the internal components of system 10. The retaining bar 38 has advantageously been designed to allow it to be captive, that is, its location is set by the path it must take around the other components. The two snap clip fastener assemblies 14 (e.g., fabricated from phosphor bronze, ¼×1" nominal size) can be assembled to the base 12 of the system/enclosure 10 in a manner similar to the way the PEMs are retained, only in this case the snap clip assemblies 14 can advantageously be hand-assembled instead of pressed-in using a tool (which is usually a hydraulic press in the case of PEMs). The retaining bar 38 can be placed in a rough position, and guided into slots in the top cover 30 as the top cover 30 is pressed down, with the components then snapping together in a quasi-permanent arrangement of system 10. In certain embodiments, disassembly of the resultant system/enclosure 10 could then require damaging or destroying one or both snap clip assemblies 14, giving the system/enclosure 10 inherent tamper-resistance.

In another embodiment and as shown in FIGS. 11-15, two fastener assemblies 14 are configured and dimensioned to mount to a base member 112 of a media patching system 100 (e.g., larger systems 100, such as a FC drawer system 100). In general, media patching system 100 is configured and dimensioned to be used as a patching system for media connections, as similarly described above in connection with system/enclosure 10.

A panel member 120 (e.g., patch panel member/multiconnector panel member 120) can be utilized with system 100 to support multiple media connections (e.g., copper and/or fiber optic connections). Exemplary panel member 120 has a front panel surface that includes a plurality of apertures therethrough, with each aperture configured to have a connector assembly/connective device (e.g., ports/adapters, cassettes, etc.) mounted with respect thereto.

Figure 11:
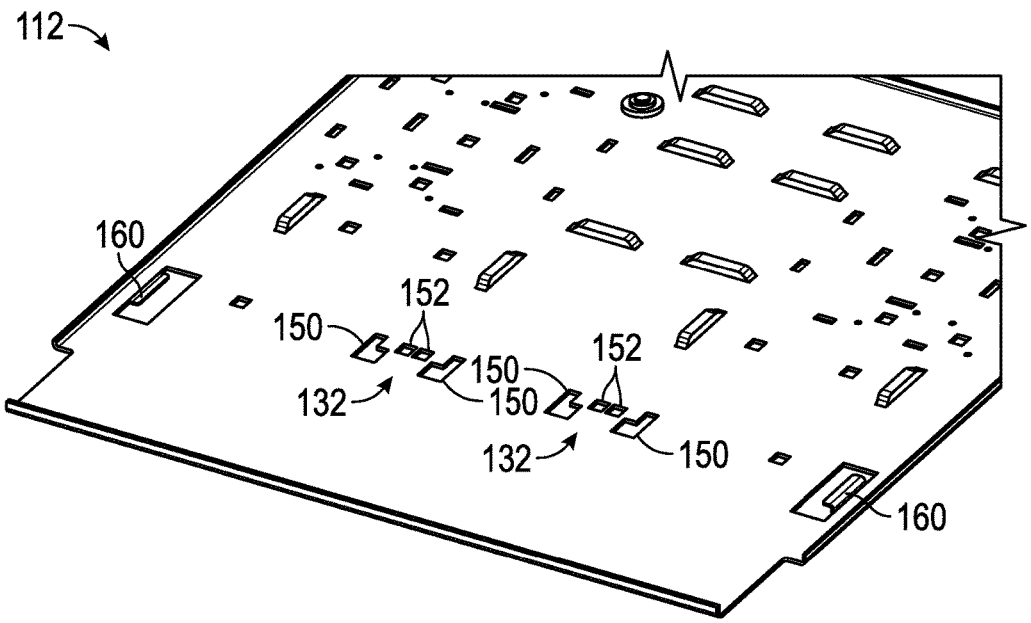
FIG. 11 is a side perspective view of another exemplary base member of a media patching system of the present disclosure.
Figure 12:
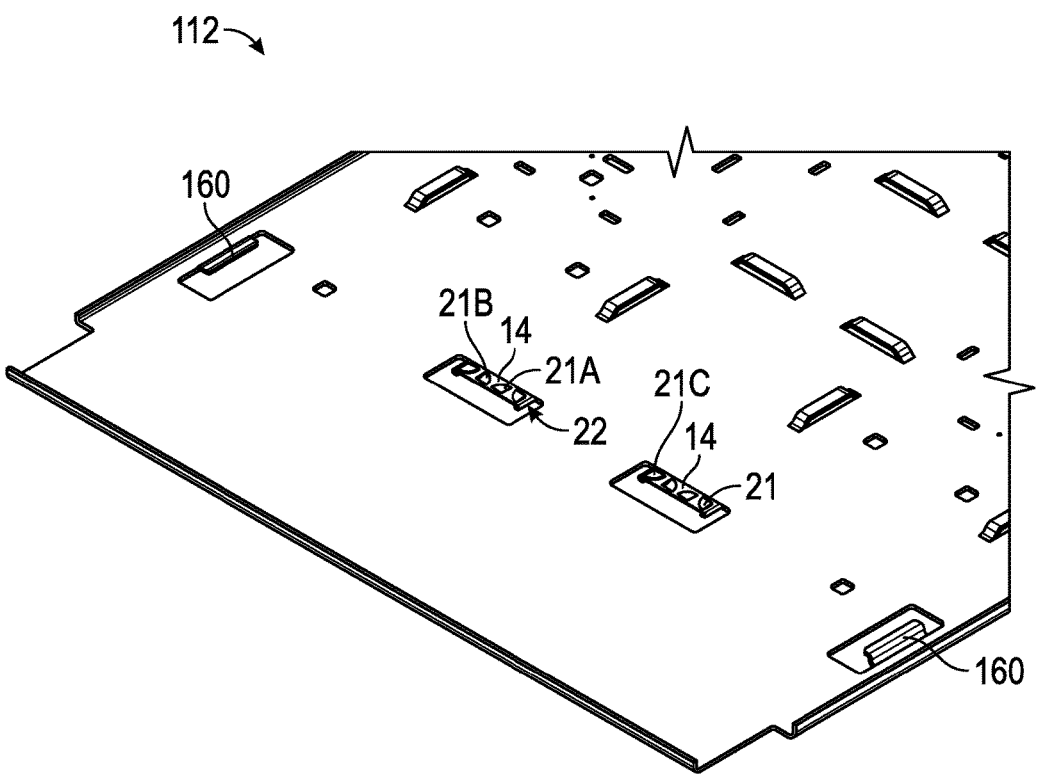
FIG. 12 is a side perspective view of the base member of FIG. 11, with exemplary fastener assemblies mounted to the base member.

As shown in FIGS. 11-12, exemplary base member 112 of media patching system 100 includes two mounting areas 132 on a surface of member 112. Each mounting area 132 includes two mounting slots 150 and two holes 152 therethrough positioned between the two mounting slots.

A fastener assembly 14 is configured and adapted to be positioned over a mounting area 132 until inner protrusion members 21A, 21B are securely positioned within a respective hole 152 of area 132 (e.g., via an interference or snap-fit engagement of members 21A, 21B in holes 152). Moreover, the hemmed sections 22 wrap around and secure/mount to the slots 150 of the area 132. As such and as shown in FIG. 12, fastener assembly 14 can be secured/mounted to area 132 of base member 112, with the front side 13 of wall 16 facing upwards (away from member 112), and with the rear side 15 of wall 16 facing in the downward direction, and with members 21A, 21B positioned within holes 152 and extending from the rear side 15 and into holes 152, and hemmed sections 22 mounted to slots 150. It is noted that the exemplary 180° design/shape of the hemmed sections 22 and pocket 24 advantageously facilitate mounting of assembly 14 to member 112 by hand (e.g., without the use of tools).

In short, the inner protrusion members 21A, 21B operate along with the hems 22 to retain assembly 14 onto its mounting location on member 112. Protrusion members 21 and 21C extend from front side 13, in the upward direction and away from base member 112.

Figure 13:
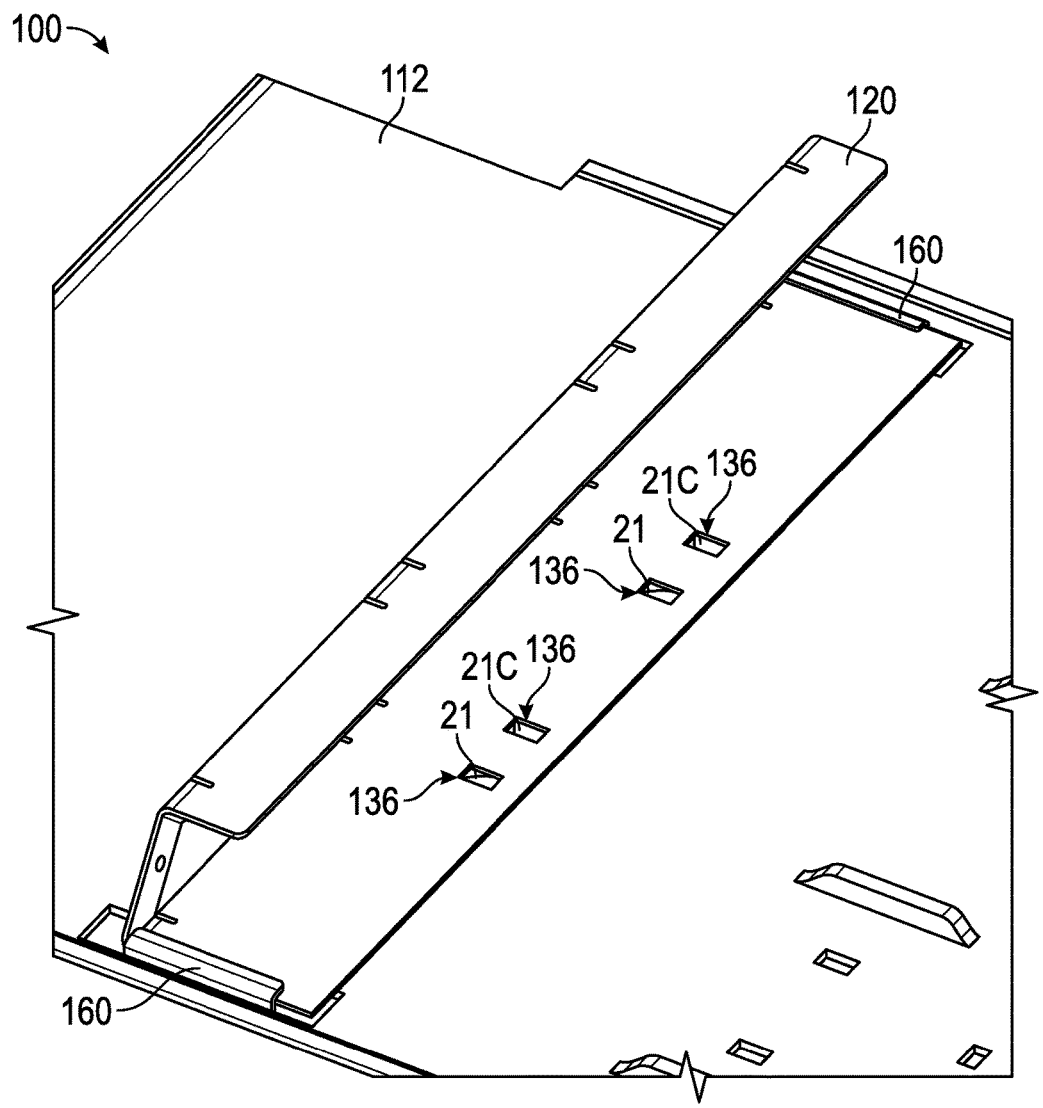
FIGS. 13-15 are side perspective views of the base member, mounted fastener assemblies, and a panel member, after assembly.
Figure 14:
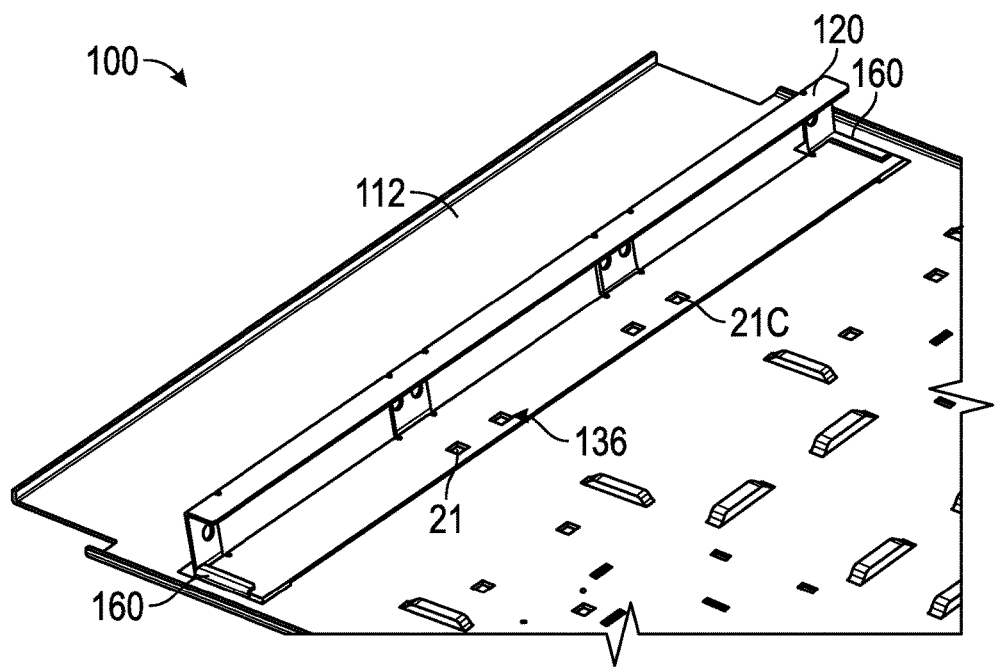
Figure 15:
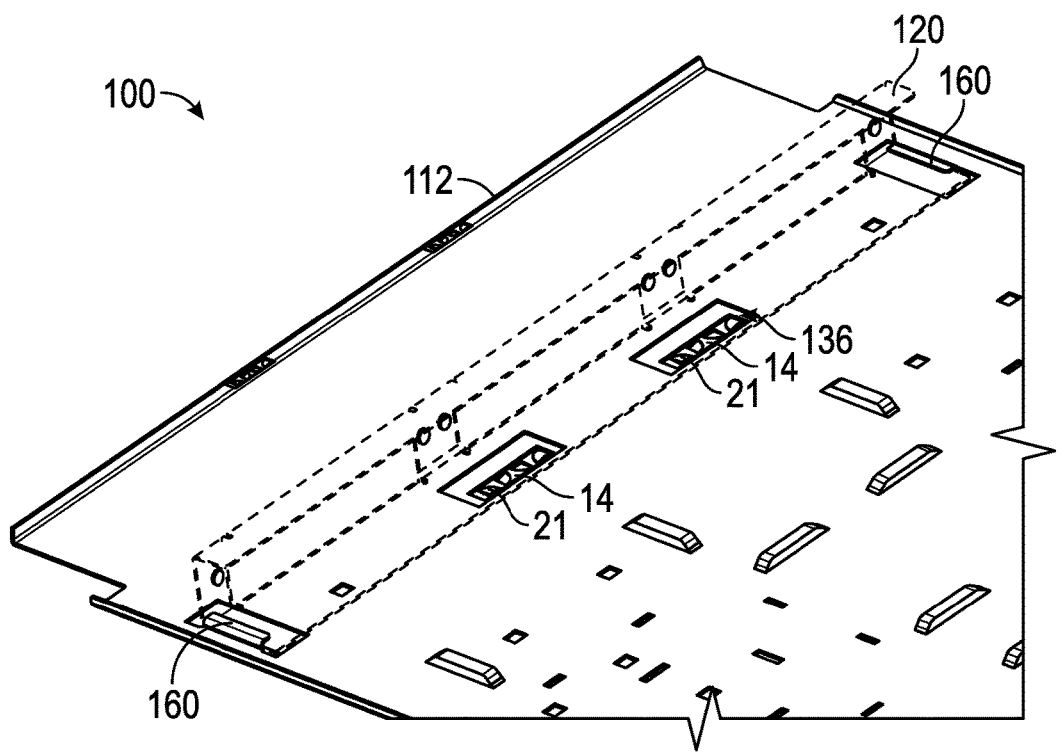

As shown in FIGS. 13-15, a panel member 120 can then be mounted (e.g., snap fit) onto the base member 112 with mounted assemblies 14, and with the protrusion members 21, 21C securely positioned within a respective hole 136 of panel member 120 (e.g., via an interference or snap-fit engagement of members 21, 21C in holes 136). As shown in FIG. 13, panel member 120 includes one or more holes 136 (e.g., four square holes 136).

In short, mounting geometry (e.g., slots 150, holes 152) can be cut into the base part 112, in this case the drawer system's 100 main tray/member 112, allowing a pair of snap clip fastener assemblies 14 to be snapped into position. In some embodiments, slightly larger steel clip assemblies 14 can be utilized, but they are otherwise similar as the phosphor bronze clip assemblies 14 discussed above. Tray member 112 can also include return/jog features or members 160 on either side of the tray 112. The panel member 120 will slide under these features/members 160, then ride over the clip assemblies 14 and snap into place (FIG. 13).

FIG. 13 shows the assembled drawer face/panel member 120 from an angle further towards the back of the tray 112. Again, square holes 136 match up against the outer detents 21, 21C of the snap clip assemblies 14, so as the part/member 120 is slid into position, it will snap and lock into place. In this case, six conventional parts (tray, face, two PEMs and two nylock nuts) are replaced with just four parts (tray 112, face/member 120 and two snap clips 14), and the need for assembly tools (e.g., a press for the PEMs and a wrench for the nuts) is eliminated altogether. Additionally, this system/method opens up additional space on the drawer face 120 which can be populated by signal components or the like. Presently, conventional PEMs and nuts can take about ½" from the usable width of the drawer 120, or ½" from the usable height of the enclosure 100, which may be highly advantageous (e.g., when one is trying to jam as much as one can into a given space, which is especially challenging in a 1 U enclosure, every bit of additional clearance can be very important).

Thus and as shown in FIGS. 11-15, instead of the snap clips 14 being mounted vertically, they are mounted horizontally, using formed returns 160 on either side to hold the drawer face 120 down as it is slid into position from the front, locking it in place as soon as it reaches the proper depth. This style of assembly can require some supporting features in the sheet metal base 112, but it also allows the use of snap clips 14 in places where sufficient vertical space may not be available, and in the case where the component (e.g., 120) being secured is suitably small, allows securing with a single clip 14 instead of two. In certain embodiments, one broad surface only is needed to enable the use of a clip 14, instead of two for other assembly methods. This is of particular interest when clips 14 may be considered as a substitute for welds or rivets, which may enable clips 14 with just two detents (e.g., 21 and 21A, and instead of the four of exemplary clip 14) to be employed in securing small/thin components. This system/method of assembly can also result in a finished product (10, 100, 200) which has a firmer and tighter feel to it, and has a better overall aesthetic look (since the clips 14 can be less visible), as compared to conventional methods (e.g., the spanning method).

Within some limits of scale to which an exemplary snap clip assembly 14 is applicable (e.g., which should easily cover systems on the order of a 4 U enclosure or smaller), this type of fastener assembly 14 can provide important advantages of material cost, labor costs, tool requirements, and space occupied, as compared to the conventional rivets, PEMs, and threaded fasteners it can replace. In certain embodiments, assembly 14 is particularly applicable to sheet metal, though it is not limited to sheet metal, and allows sheet metal to be used and assembled in new ways and at lower cost. Metal stampings like exemplary assembly 14 are low cost in volume, because they can be produced rapidly in large numbers using stamping dies which essentially last a very long time.

Figure 16:
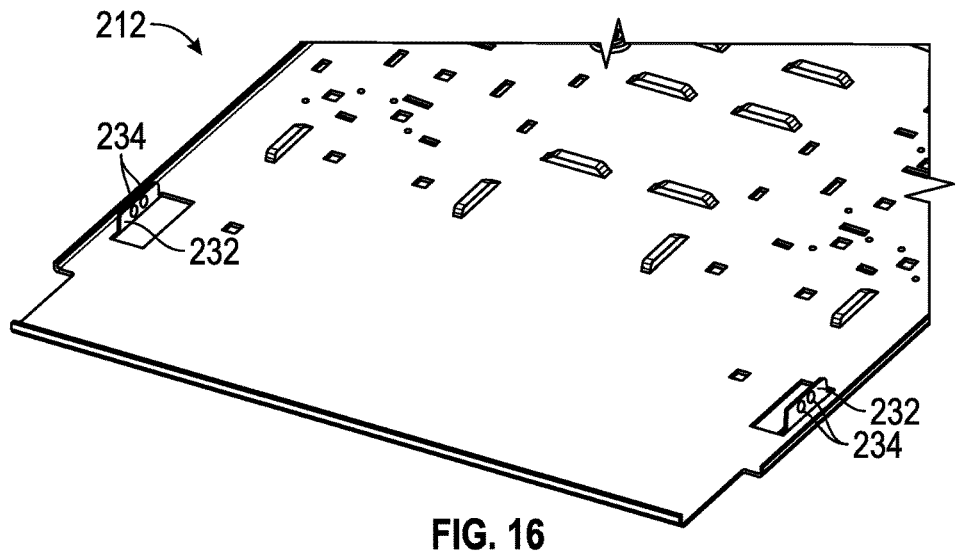
FIG. 16 is a side perspective view of another exemplary base member of a media patching system of the present disclosure.
Figure 17:
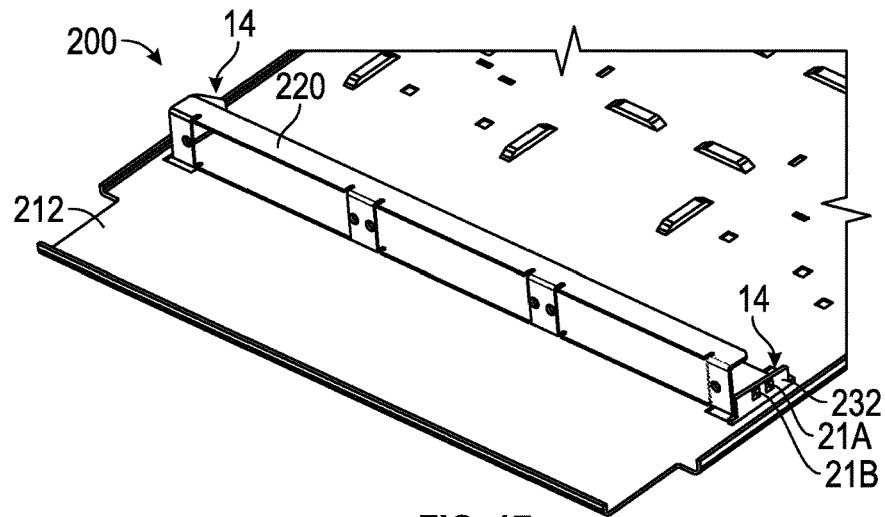
FIGS. 17-18 are side perspective views of the base member, mounted fastener assemblies, and a panel member, after assembly.
Figure 18:
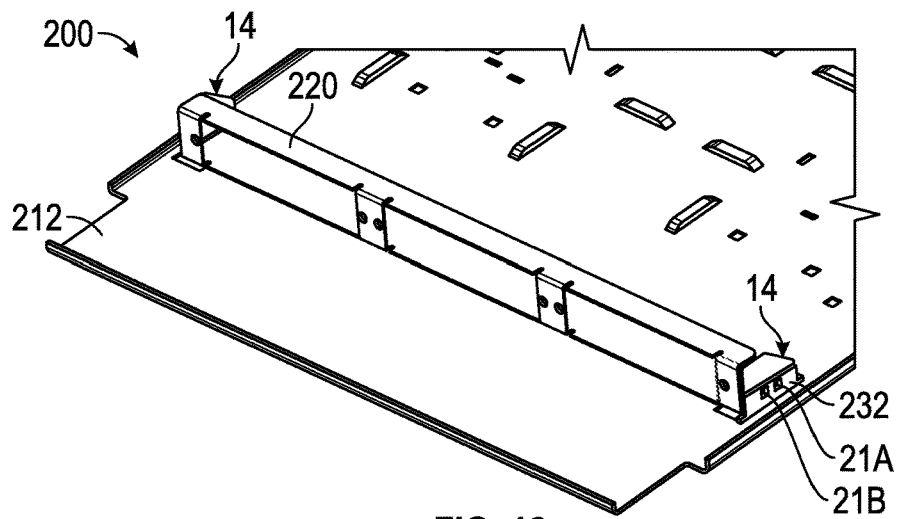

In another embodiment and as shown in FIGS. 16-18, two fastener assemblies 14 are configured and dimensioned to mount to a base member 212 of a media patching system 200 (e.g., FC drawer system 200, similar to system 100). In general, media patching system 200 is configured and dimensioned to be used as a patching system for media connections, as similarly described above in connection with system/enclosure 10, 100.

A panel member 220 (e.g., patch panel member/multi-connector panel member 220) can be utilized with system 200 to support multiple media connections. Exemplary panel member 220 has a front panel surface that includes a plurality of apertures therethrough, with each aperture configured to have a connector assembly/connective device (e.g., ports/adapters, cassettes, etc.) mounted with respect thereto.

As shown in FIGS. 16-18, exemplary base member 212 of media patching system 200 includes a mounting tab member 232 on each side of member 212. Each tab member 232 includes one or more holes 234 therethrough (e.g., two square holes 234).

A fastener assembly 14 is configured and adapted to be positioned over a tab member 232 until inner protrusion members 21A, 21B are securely positioned within a respective hole 234 of tab member 232 (e.g., via an interference or snap-fit engagement of members 21A, 21B in holes 234). Moreover, the hemmed sections 22 wrap around and secure/mount to the ends of the tab member 232. As such, fastener assembly 14 can be secured/mounted to tab member 232 of base member 212, with the front side 13 of wall 16 facing inwards (toward center of member 212), and with the rear side 15 of wall 16 facing outwards and away from member 212, and with members 21A, 21B positioned within holes 234 and extending from the rear side 15 and into holes 234, and hemmed sections 22 mounted to ends of tab 232.

In short, the inner protrusion members 21A, 21B operate along with the hems 22 to retain assembly 14 onto its mounting location on tab 232. Protrusion members 21 and 21C extend from front side 13, and toward the center of base member 212.

A panel member 220 can then be mounted (e.g., snap fit) onto the base member 212 with mounted assembly 14, and with the protrusion members 21, 21C securely positioned within a respective hole (obscured) of panel member 220 (e.g., via an interference or snap-fit engagement of members 21, 21C in the holes of member 220).

FIGS. 17-18 show two options for accomplishing this, differing only in the manner in which the accepting tabs 232 on the drawer face 220 are configured. The snap clips 14 (e.g., steel, 3/8"×1½" nominal size) are mounted to geometry (232) formed from the tray base 212, again pre-assembling to the base 212 and allowing the drawer face 220 to be snapped down into position in a permanent arrangement, spanning the space between the two clips 14.

As one can see from these exemplary concepts, this fastening technology via assemblies 14 has broad and diverse potential, particularly in the realm of sheet metal. Within some scales where these exemplary clips 14 are applicable (e.g., which may safely cover systems on the scale of, or smaller than, a 4 U enclosure), they can prove to be more economical and spatially-efficient than conventional threaded connectors.

Whereas the disclosure has been described principally in connection with advantageous fastener assemblies for use with patching systems and/or enclosures for media connections, such description has been utilized only for purposes of disclosure and is not intended as limiting the disclosure. To the contrary, it is to be recognized that the disclosed fastener assemblies are capable of use with other systems, structures and/or devices (e.g., as mountable fastener assemblies for other systems, structures and/or devices).

Although the systems and methods of the present disclosure have been described with reference to exemplary embodiments thereof, the present disclosure is not limited to such exemplary embodiments and/or implementations. Rather, the systems and methods of the present disclosure are susceptible to many implementations and applications, as will be readily apparent to persons skilled in the art from the disclosure hereof. The present disclosure expressly encompasses such modifications, enhancements and/or variations of the disclosed embodiments. Since many changes could be made in the above construction and many widely different embodiments of this disclosure could be made without departing from the scope thereof, it is intended that all matter contained in the drawings and specification shall be interpreted as illustrative and not in a limiting sense. Additional modifications, changes, and substitutions are intended in the foregoing disclosure. Accordingly, it is appropriate that the appended claims be construed broadly and in a manner consistent with the scope of the disclosure.

What is claimed is:

1. A fastener assembly comprising:
   a planar wall extending from a first end to a second end;
   a first protrusion member, a second protrusion member, a third protrusion member and a fourth protrusion member extending from the planar wall, the first, second, third and fourth protrusion members extending substantially parallel to the planar wall, and the first, second, third and fourth protrusion members each define an opening through the planar wall;

wherein the first and second protrusion members are configured and dimensioned to mount with respect to a base member to secure the planar wall to the base member; and wherein the third and fourth protrusion members are configured and dimensioned to mount with respect to a panel member to permanently secure the panel member to the planar wall and to the base member, the permanently secured panel member securely retained from disassembly from the planar wall.

2. The assembly of claim 1, wherein the planar wall includes a front side and a rear side; and wherein the first and second protrusion members extend from the rear side of the planar wall; and wherein the third and fourth protrusion members extend from the front side of the planar wall.

3. The assembly of claim 2, wherein the third protrusion member is positioned proximal to the first end of the planar wall and the fourth protrusion member is positioned proximal to the second end of the planar wall; and wherein the first and second protrusion members are positioned next to one another between the third and fourth protrusion members.

4. The assembly of claim 1, wherein the first end includes a first hemmed section, the first hemmed section configured and dimensioned to mount with respect to the base member to secure the planar wall to the base member; and wherein the second end includes a second hemmed section, the second hemmed section configured and dimensioned to mount with respect to the base member to secure the planar wall to the base member.

5. The assembly of claim 4, wherein the first and second hemmed sections each include a first portion that extends substantially perpendicular away from the planar wall and a second portion that extends substantially perpendicular away from the first portion;

wherein each second portion is substantially parallel to the planar wall; and wherein each first and second portion extend to define a pocket area.

6. The assembly of claim 1, wherein the first, second, third and fourth protrusion members each take the form of a quadrant shape, and each quadrant shapes includes first and second sides that extend away from the planar wall and an arc side that is attached to the planar wall; and wherein the first and second sides are perpendicular to one another, and the arc side defines a 90° arc.

7. The assembly of claim 1, wherein the panel member has a front panel surface that includes a plurality of apertures therethrough, each aperture configured to mount with respect to a connector assembly or connective device.

8. A fastener assembly comprising:
a planar wall extending from a first end to a second end;
a first protrusion member, a second protrusion member, a third protrusion member and a fourth protrusion member extending from the planar wall;
wherein the first and second protrusion members are configured and dimensioned to mount with respect to a base member to secure the planar wall to the base member;
wherein the third and fourth protrusion members are configured and dimensioned to mount with respect to a panel member to secure the panel member to the planar wall and to the base member;
wherein the base member includes a mounting tab, the mounting tab including a first hole and a second hole; and wherein the first protrusion member is configured to mount within the first hole and the second protrusion member is configured to mount within the second hole.

9. The assembly of claim 8, wherein the panel member includes a third hole and a fourth hole; and wherein the third protrusion member is configured to mount within the third hole and the fourth protrusion member is configured to mount within the fourth hole.

10. A method of mounting a fastener assembly comprising:
providing a planar wall extending from a first end to a second end;
providing a first protrusion member, a second protrusion member, a third protrusion member and a fourth protrusion member extending from the planar wall, the first, second, third and fourth protrusion members extending substantially parallel to the planar wall, and the first, second, third and fourth protrusion members each define an opening through the planar wall;
mounting the first and second protrusion members with respect to a base member to secure the planar wall to the base member; and
mounting the third and fourth protrusion members with respect to a panel member to permanently secure the panel member to the planar wall and to the base member, the permanently secured panel member securely retained from disassembly from the planar wall.

11. The method of claim 10, wherein the planar wall includes a front side and a rear side; and wherein the first and second protrusion members extend from the rear side of the planar wall;

wherein the third and fourth protrusion members extend from the front side of the planar wall;

wherein the third protrusion member is positioned proximal to the first end of the planar wall and the fourth protrusion member is positioned proximal to the second end of the planar wall; and wherein the first and second protrusion members are positioned next to one another between the third and fourth protrusion members.

12. The method of claim 10, wherein the first end includes a first hemmed section, the first hemmed section configured and dimensioned to mount with respect to the base member to secure the planar wall to the base member; and wherein the second end includes a second hemmed section, the second hemmed section configured and dimensioned to mount with respect to the base member to secure the planar wall to the base member.

13. The method of claim 12, wherein the first and second hemmed sections each include a first portion that extends substantially perpendicular away from the planar wall and a second portion that extends substantially perpendicular away from the first portion;

wherein each second portion is substantially parallel to the planar wall; and wherein each first and second portion extend to define a pocket area.

14. The method of claim 10, wherein the first, second, third and fourth protrusion members each take the form of a quadrant shape, and each quadrant shapes includes first and second sides that extend away from the planar wall and an arc side that is attached to the planar wall; and wherein the first and second sides are perpendicular to one another, and the arc side defines a 90° arc.

15. The method of claim 10, wherein the panel member has a front panel surface that includes a plurality of apertures therethrough, each aperture configured to mount with respect to a connector assembly or connective device.

16. A method of mounting a fastener assembly comprising:
providing a planar wall extending from a first end to a second end;
providing a first protrusion member, a second protrusion member, a third protrusion member and a fourth protrusion member extending from the planar wall;
mounting the first and second protrusion members with respect to a base member to secure the planar wall to the base member; and
mounting the third and fourth protrusion members with respect to a panel member to secure the panel member to the planar wall and to the base member;
wherein the base member includes a mounting tab, the mounting tab including a first hole and a second hole; and
wherein the first protrusion member mounts within the first hole and the second protrusion member mounts within the second hole.

17. The method of claim 16, wherein the panel member includes a third hole and a fourth hole; and
wherein the third protrusion member mounts within the third hole and the fourth protrusion member mounts within the fourth hole.

18. A fastener assembly comprising:
a planar wall including a front side and a rear side and extending from a first end to a second end, the first end including a first hemmed section and the second end including a second hemmed section;
a first protrusion member, a second protrusion member, a third protrusion member and a fourth protrusion member extending from the planar wall;
wherein the first and second protrusion members extend from the rear side of the planar wall;
wherein the third and fourth protrusion members extend from the front side of the planar wall;
wherein the first and second protrusion members and the first and second hemmed sections are configured and dimensioned to mount with respect to a base member to secure the planar wall to the base member; and
wherein the third and fourth protrusion members are configured and dimensioned to mount with respect to a panel member to secure the panel member to the planar wall and to the base member.

\* \* \* \* \*